(12) United States Patent
Dietz et al.

(10) Patent No.: US 6,404,200 B1
(45) Date of Patent: Jun. 11, 2002

(54) MAGNETIC RESONANCE TOMOGRAPHY APPARATUS WITH VACUUM-INSULATED GRADIENT COIL SYSTEM

(75) Inventors: Peter Dietz, Nuremberg; Matthias Gebhardt; Wolfgang Renz, both of Erlangen, all of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/649,497

(22) Filed: Aug. 28, 2000

(30) Foreign Application Priority Data

Aug. 26, 1999 (DE) .......................................... 199 40 550

(51) Int. Cl.⁷ ................................................ G01V 3/00
(52) U.S. Cl. ........................ 324/318; 324/307; 324/309
(58) Field of Search .......................... 324/318; 329/318, 329/309, 307

(56) References Cited

U.S. PATENT DOCUMENTS

| 4,652,824 | A | 3/1987 | Oppelt |
| 5,489,848 | A | 2/1996 | Furukawa |
| 5,617,026 | A | 4/1997 | Yoshino et al. |
| 5,698,980 | A | 12/1997 | Sellers et al. |
| 5,793,210 | A | 8/1998 | Pia et al. |
| 6,157,276 | A | * 12/2000 | Hedeen et al. ............... 324/318 |

FOREIGN PATENT DOCUMENTS

| DE | 38 33 591 | 4/1990 |
| EP | 0 138 269 | 4/1985 |

* cited by examiner

Primary Examiner—Edward Lefkowitz
Assistant Examiner—Dixomara Vargas
(74) Attorney, Agent, or Firm—Schiff Hardin & Waite

(57) ABSTRACT

A magnetic resonance tomography apparatus has a basic field magnet system and a gradient coil system. At least a part of a vacuum housing of an evacuatable space is thereby formed by at least a surface region of the basic field magnet system and by at least a surface region of the gradient coil system. Propagation of oscillations (vibrations) of the gradient coil system to the basic field magnet system via an intermediate layer between those surfaces of the gradient coil system and of the basic field magnet system that face each other is prevented by a vacuum in the evacuatable space. In economical and space-saving fashion, the vacuum housing of the evacuatable space is formed to a large part by systems that are already needed for the operation of the apparatus.

16 Claims, 4 Drawing Sheets

MAGNETIC RESONANCE TOMOGRAPHY APPARATUS WITH VACUUM-INSULATED GRADIENT COIL SYSTEM

BACKGROUND OF THE INVENTION

1. Field of the Invention

The present invention is directed to a magnetic resonance tomography apparatus that contains a basic field magnet system and a gradient coil system.

2. Description of the Prior Art

Magnetic resonance tomography is a known technology for acquiring images of the inside the objects of, in particular, the body of a living examination subject. To this end, a magnetic resonance tomography apparatus has a space for the acceptance of the examination subject, what is referred to as an examination space or volume. The examination space is at least partially spatially limited by a surface of the apparatus that surrounds it. The majority of the aforementioned limiting surface is normally formed by a surface belonging to the gradient coil system and another, normally a small portion is formed by a part of an outer envelope of the basic field magnet system. At least in a partial volume sub-region of the examination space, the basic field magnet system generates an optimally uniform, static basic magnetic field on which the gradient coil system superimposes rapidly switched magnetic fields with approximately constant gradients, referred to as gradient fields, in all three spatial directions. Currents whose amplitudes reach several 100 A and that are subject to frequent and fast changes in the current direction with rise and decay rates of several 100 kA/s thereby flow in the gradient coils. These currents are controlled on the basis of pulse sequences and, in the presence basic magnetic field on the order of magnitude of one Tesla, cause oscillations (vibrations) of the gradient coil system due to Lorentz forces.

These oscillations are transmitted via various propagation paths onto the entire surface of the magnetic resonance tomography apparatus. The mechanical oscillations of the various surface regions are transformed into sound oscillations dependent on the surface speed of these surface regions, these sound oscillations ultimately causing sound emissions.

The entire surface of a magnetic resonance tomography apparatus essentially includes the outer envelope of the basic field magnet system—which forms by far the greatest part—as well as the surface of the gradient coil system, including the devices such as radio frequency antennas mounted at the gradient coil system. Dependent on the measuring location, the envelope of the basic field magnet system is the dominant noise source. This is also true for the examination space, which is essentially limited by the surface of the gradient coil system.

Two transmission paths dominate in the transmission of the oscillations of the gradient coil system onto the envelope of the basic field magnet system. A first transmission path proceeds via a more or less thin intermediate layer between those surfaces of the gradient coil system and the basic field magnet system that directly adjoin one another. This intermediate layer is normally filled by air, which behaves as a transmission medium air. A second transmission path proceeds via a direct mechanical connection of the gradient coil system to the basic field magnetic system, for example due to a press fit of the gradient coil system in a hollow opening of the basic field magnet system.

Developments in the field of magnetic resonance tomography for shortening measuring times and for improving imaging properties involve faster and faster pulse sequences. These cause an increase in the current amplitudes as well as an increase in the current rise and decay rates in the gradient coils. Without counter-measures, this leads to greater noise via more pronounced oscillations due to larger Lorentz forces and a fast change in the effective direction of the Lorentz forces.

German OS 38 33 591 discloses a magnetic resonance tomography apparatus with a tubular gradient coil system which is arranged without supports inside the hollow opening of the basic field magnet system, and which is adjustably carried by a supporting frame that is located outside the basic field magnet system. To this end, the entire gradient coil system is lengthened beyond the longitudinal dimension of the basic field magnet system. The intent is for no mechanical oscillations of the gradient coil system to be transmitted onto the basic field magnet system, and to allow the gradient coil system to be correctly adjustable in the basic magnetic field. The direct mechanical transmission of oscillations via the aforementioned second transmission path is in fact suppressed; however, the aforementioned first transmission path via the intermediate layer is neither damped nor suppressed.

German OS 195 31 216 discloses a magnetic resonance tomography apparatus with a gradient coil system secured to the basic field magnet system via at least one support mount, wherein the support mount is located in the region of an oscillation node of the gradient coil system that is expected during operation. In one embodiment, the support mount includes a damping element. Disadvantageous influences of oscillations of the gradient coil system, for instance acoustic and structural noises, as well as in the image quality (artifacts) are to be avoided as a result. Although improvements again are achieved for the second transmission path, the first transmission path is again neither damped nor suppressed.

German OS 197 34 138 discloses a magnetic resonance tomography apparatus with a gradient coil system arranged in a vacuum encapsulation for reducing noise. The gradient coil system is carried within the vacuum encapsulation by a number of insulating or individually damping fastening devices that are arranged spaced from each other. The fastening devices are formed either as a rubber-like damping fastening with rigid support mount or as a spring-damping fastening with a supporting flange. The fastenings are connected to the gradient coil system and the rigid support mount or the supporting flange of each fastener is connected to the vacuum encapsulation. A damping of the second transmission path and a suppression of the first transmission path dependent on the quality of the vacuum are thereby achieved. Disadvantages arise, however, due to the complete, separate vacuum encapsulation of the gradient coil system. Accessibility to the overall gradient coil system as well as to devices secured to the inside wall of the gradient coil system, for example radio frequency antennas, is significantly impaired due to the vacuum encapsulation, thereby making maintenance and repair more difficult. Further, the vacuum encapsulation of the gradient coil system involves an increase in cost and a reduction of the volume available in the examination space.

In addition to the aforementioned published German applications that disclose structures for effecting damping or suppression of the first and/or second transmission path, German OS 44 32 747 discloses a fundamental reduction of oscillations of the gradient coil system on the basis of an active measure. To that end, a force generator, particularly containing piezoelectric components, is arranged in or at the gradient coil system. These components generate forces that oppose the oscillations of the gradient coil system, so that a deformation of the gradient coil system is essentially prevented. To that end, the piezoelectric components are suitably driven by a voltage applied to them. The introduction or attachment of a number of piezoelectric components into the comparatively spatially extensive gradient coil system, the voltage supply lines thereto, as well as the drive circuitry involve great technical and economic outlay.

SUMMARY OF THE INVENTION

An object of the present invention is to provide an economical magnetic resonance tomography apparatus with low noise emission that avoids the aforementioned disadvantages.

This object is inventively achieved in a magnetic resonance tomography apparatus wherein at least a part of a vacuum housing of an evacuatable space is formed by at least one portion (surface region) of the basic field magnet system, preferably a region of the outer envelope thereof, and by at least one portion (surface region) of the gradient coil system. Components thus are utilized for the formation of the evacuatable space for the purpose of noise reduction that are already necessary for the operation of a magnetic resonance tomography apparatus and that often already have the property of vacuum tightness. A closed, separate, expensive vacuum housing is not necessary because regions of the gradient coil system as well as of the basic field magnet form a majority of the vacuum housing.

In an embodiment, the evacuatable space extends at least between those surfaces of the basic field magnetic system and of the gradient coil system facing directly toward one another. As a result, at least the intermediate layer of the initially cited, first transmission path can be contained in a vacuum. The first transmission path for noise-producing oscillations thus can be suppressed.

In another embodiment, the aforementioned vacuum housing is formed by the vacuum housing of a basic field magnet system having superconducting coil arrangement. As a result, for example, a part of the vacuum housing of the superconducting basic field magnet system that is needed anyway is substituted by the gradient coil system. This saves material and thus costs. Moreover, more freedom is gained within the volume in the examination space.

In another embodiment, a further part of the vacuum housing of the evacuatable space is formed by a seal flange. A closed vacuum housing for the evacuatable space between gradient coil system and basic field magnet system already can be realized with the utilization of seal flanges in many apparatuses. This represents a very simple and economical solution. Further, only minimal structural adaptations are necessary given conventional magnetic resonance tomography apparatus to produce the evacuatable space between those surfaces of the basic field magnet system and of the gradient coil system facing directly toward one another. Further, the accessibility of the surface of the gradient coil system facing away from the basic magnet system, and the case for maintenance and repair, are not impaired. The aforementioned surface of the gradient coil system—to which radio frequency antennas are often secured—remains freely accessible.

In another embodiment, the vacuum housing of the evacuatable space contains a valve device that enables an evacuation of the evacuatable space. The implementation of a seal flange with the aforementioned valve device is especially advantageous. The valve device creates the possibility of evacuating the evacuatable space, for example by pumping out with a vacuum pump, after the mounting of the seal flange has ensued. In conjunction with easily releasable seal flanges, for example for the purpose of maintenance and repair tasks at the complete gradient coil system, a seal flange can be removed and re-mounted after the end of the work and the vacuum can be restored in a simple way.

Further embodiments, in addition to suppressing the first transmission path on the basis of the aforementioned evacuatable space, have at least a damping influence on the second transmission path.

In an embodiment for this purpose, the gradient coil system is connected in a weight-bearing fashion to the basic field magnet system at the location of the dominant natural oscillation node of the gradient coil system. In addition to the suppression of the first transmission path by the vacuum intermediate layer, the noise propagation via the second transmission path is thereby also reduced. The aforementioned German OS 195 31 216 is referenced for a detailed description of the fastening of the gradient coil system at its dominant natural oscillation node.

In a further embodiment, the magnetic resonance tomography apparatus has a carrier for the gradient coil system that enables support of the gradient coil system, preferably at the floor of an installation room, in a manner that is decoupled from the basic field magnet system.

In an embodiment for this purpose, a hollow-cylindrical (tubular) gradient coil system has carrying elements projecting from the lower region of an end face perpendicular to the principal cylinder axis. As a result, a support that is decoupled from the basic field magnet system is possible by lengthening the gradient coil system in that region wherein a transport and support device for an examination subject, for example a patient bed, is normally arranged. Differing from an extension of the complete gradient coil system, the accessibility to the examination space is hardly restricted and the confining volume is not enlarged which is important for acceptance by patients having claustrophobia. The support of the gradient coil system decoupled from the basic field magnet system nearly completely suppresses the second transmission path. Care must thereby be exercised in the fashioning of the evacuatable space, for example on the basis of the attachment of seal flanges, so that a noise producing coupling of the gradient coil system to the basic field magnet system in the sense of a second transmission path does not in turn arise due to the implementation and fastening of the seal flange.

In another embodiment, the basic field magnet system, preferably the outer envelope thereof, and/or a connection between the gradient coil system and the basic field magnet system, contains at least one part of a decoupling mechanism that prevents the propagation of oscillations of the gradient coil system onto the overall outer envelope of the basic field magnet system.

In a particular embodiment, for this purpose, the decoupling mechanism contains a device, preferably embodied as a bellows or an element made of elastic material, that acts in oscillation-decoupling fashion due to its mechanical properties.

In another embodiment for this purpose, the decoupling mechanism contains actuators, preferably embodied as piezoelements, whose spatial size is designed such that they have an oscillation-decoupling effect. The aforementioned German OS 44 32 747 is referenced for a detailed disclosure of the fundamental functioning of piezoelements for oscillation suppression. Compared to the aforementioned publication, however, a number of piezoelements are not arranged over the comparatively spatially extensive gradient coil system; rather, in accordance with the invention piezoelements are arranged in a comparatively small spatial region, for example in the proximity of the connection between the gradient coil system and the basic field magnet system. In this small region, they prevent a transmission of oscillations of the gradient coil system onto the envelope of the basic field magnet system. The economic outlay for this is correspondingly more beneficial and a significant noise-reducing effect is still achieved.

DESCRIPTION OF THE PREFERRED EMBODIMENTS

Figure 1:
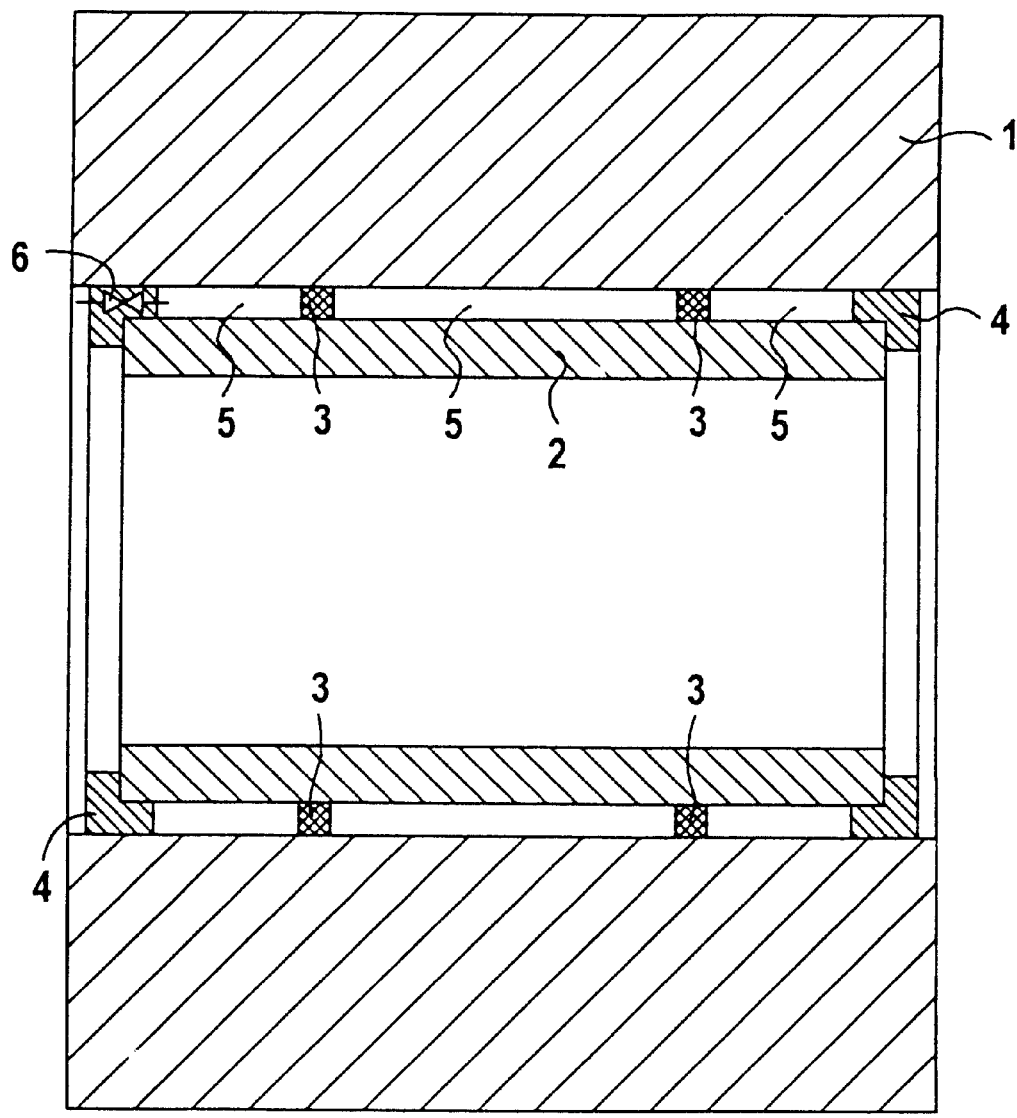
FIG. 1 is a longitudinal section through an inventive magnetic resonance tomography apparatus having sealing flanges and having a gradient coil system secured at its natural oscillation node.

As an embodiment of the invention, FIG. 1 shows a longitudinal section through a hollow-cylindrical basic field magnet system 1 having a hollow opening wherein a hollow-cylindrical gradient coil system 2 is arranged. The gradient coil system 2 is connected to the basic field magnet system 1 via connecting devices 3 at the dominant natural oscillation node which is expected during operation. The connecting devices 3 thereby produce a connection between the gradient coil system 2 and the basic field magnet system 1 at a number of points along the circumference. Due to the attachment of two seal flanges 4, an interconnected, evacuatable space 5 arises between those surfaces of the gradient coil system 2 and of the basic field magnet system 1 facing directly toward one another. One of the seal flanges 4 contains a valve device 6 that enables an evacuation of the evacuatable space 5, for example in conjunction with a vacuum pump connected thereto. In one embodiment, the seal flanges 4 are connected to the gradient coil system 2 and to the basic field system 1 in easily releasable fashion, for example via screwed connections. As a result, the seal flanges 4 can be removed, for example for the purpose of maintenance or repair tasks at the overall gradient coil system 2, and can be remounted after the end of the work. The valve device 6 thereby allows an evacuation of the evacuatable space 5 after the end of the aforementioned tasks. Further, the valve device 6 can be fashioned such that the evacuatable space 5 is aerated via the valve device 6 before beginning the work. Due to the vacuum in the evacuatable space 5, transmission of oscillations of the gradient coil system 2 via the intermediate layer between the two systems in the sense of the initially cited, first transmission path is prevented during operation of the apparatus.

Further, the connection of the gradient system to the basic field magnet system 1 at its dominant natural oscillation node also at least damps the transmission of oscillations via the direct mechanical connection in the sense of the initially cited, second transmission path. Care should be exercised in the implementation of the seal flange 4 and/or the fastening thereof so that a noise-producing transmission of oscillations in the sense of the second transmission path does not again occur via this component.

Figure 2:
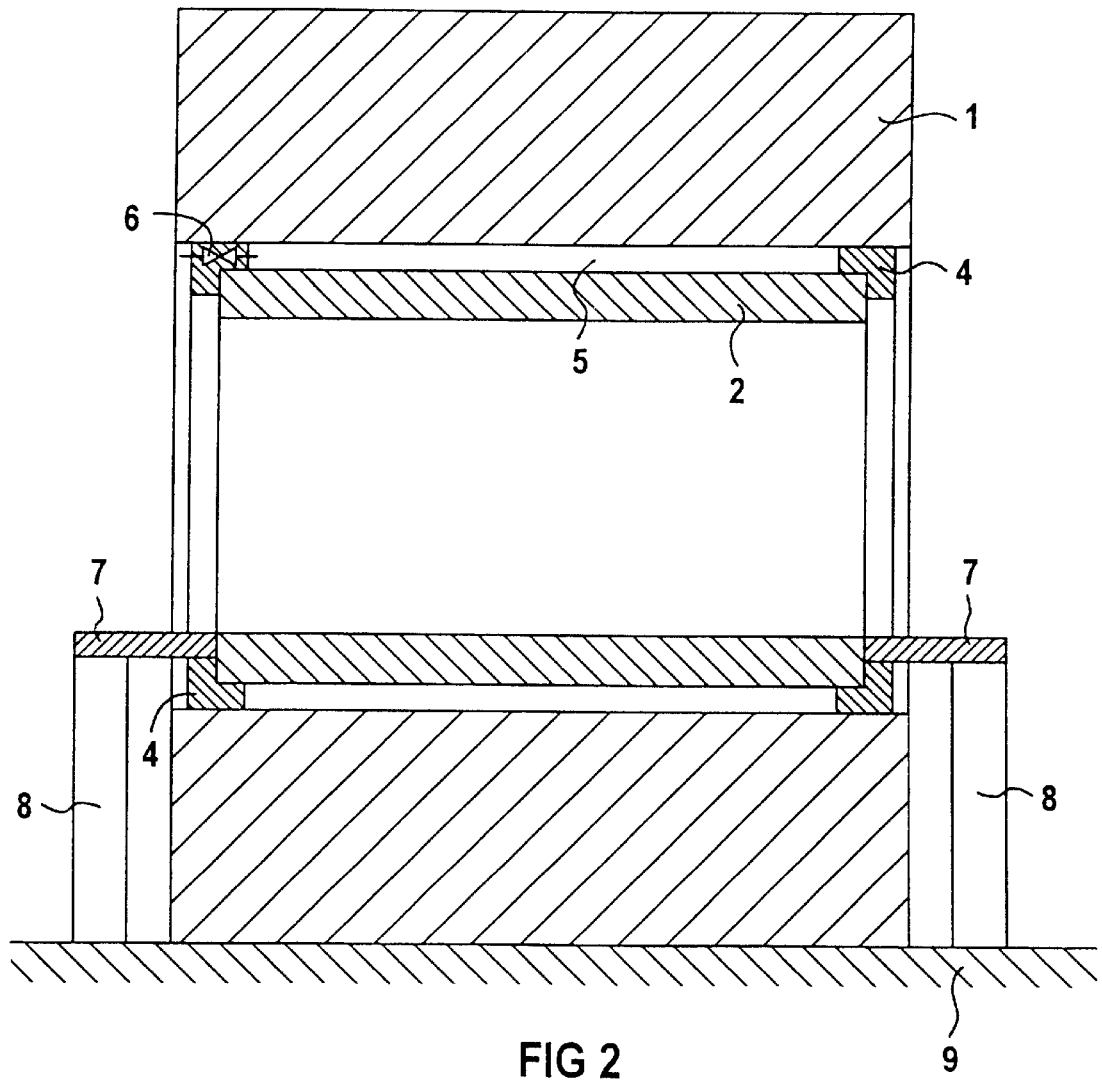
FIG. 2 is a longitudinal section through an inventive magnetic resonance tomography apparatus having seal flanges and having a gradient coil system that is mounted independently of the basic field magnet system.

As a further embodiment of the invention, FIG. 2 shows a longitudinal section through a magnetic resonance tomography apparatus having the hollow-cylindrical basic field magnet system 1 and the gradient coil system 2. Compared to FIG. 1, the gradient coil system 2 in FIG. 2 is not connected to the basic field magnet system 1 at its dominant natural oscillation node. Instead, the hollow-cylindrical gradient coil system 2 has carrying elements 7 projecting perpendicularly to the principal cylinder axis in the lower region at both end faces. The carrying elements 7 enable a support of the gradient coil system 2 decoupled from the basic field magnet system 1 via a carrying device 8, for example on a floor 9 of an installation room. In the embodiment according to FIG. 2 as well, transmission of oscillations of the gradient coil system 2 via the first transmission path is prevented by the vacuum in the evacuatable space 5. Transmission of oscillations via the second transmission path is prevented by the support of the gradient coil system 2 that is implemented independently of the basic field magnet system 1. Care must again be exercised so that a noise-producing transmission of oscillations in the sense of the second transmission path does not occur again due to the implementation of the seal flange 4 and/or the fastening thereof.

Figure 3:
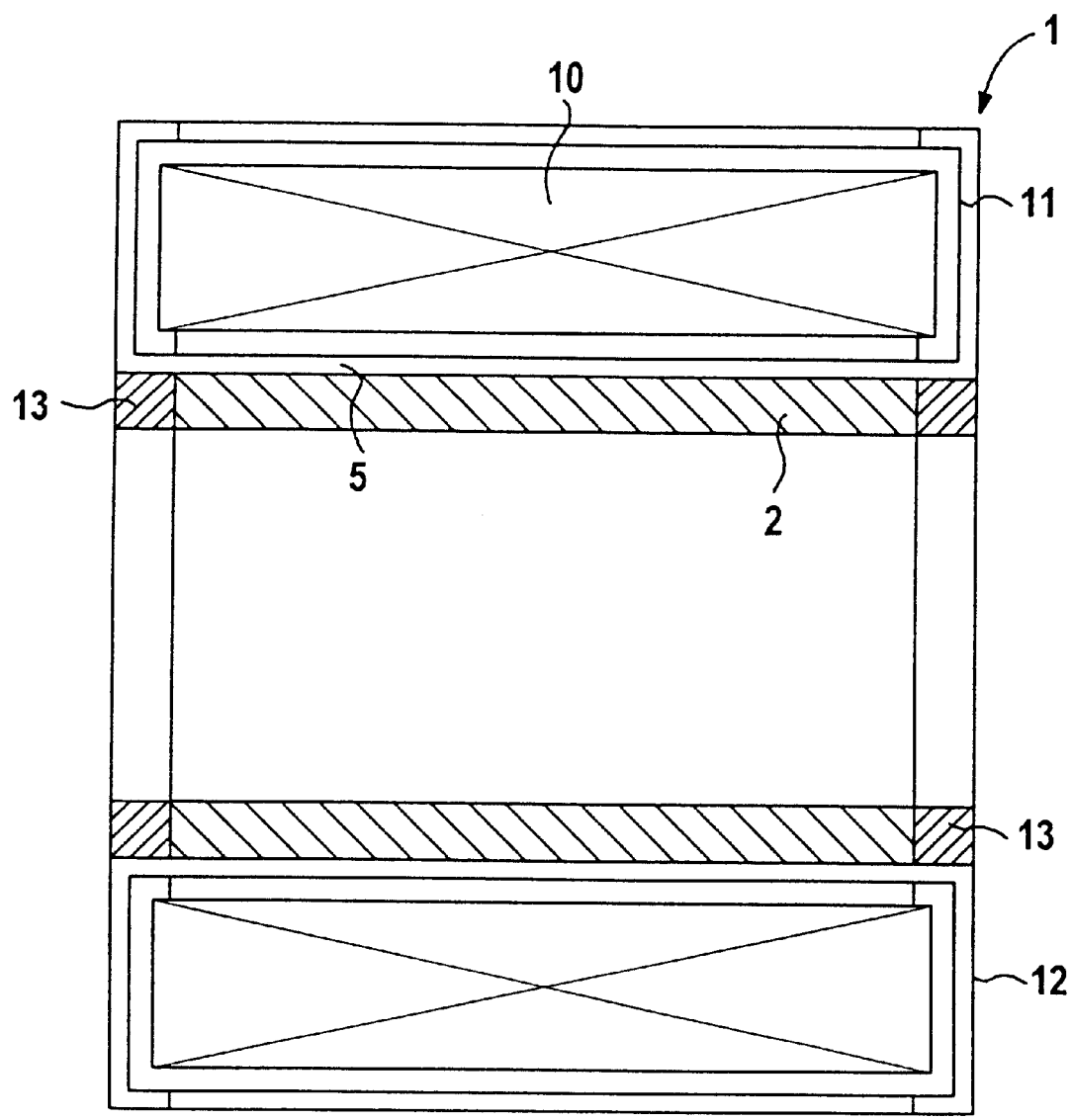
FIG. 3 is a longitudinal section through an inventive magnetic resonance tomography apparatus having a gradient coil system as part of the vacuum housing of a superconducting basic field magnet and having a decoupling mechanism.

As a further embodiment of the invention, FIG. 3 shows a longitudinal section through a magnetic resonance tomography apparatus having the hollow-cylindrical basic field magnet system 1. The basic field magnet system contains a superconducting coil arrangement 10. The superconducting coil arrangement 10 is surrounded by at least one cold shield 11, and the cold shield 11 is in turn surrounded by a vacuum housing 12. The gradient coil system 2 is connected via a decoupling device 13 to the remaining vacuum housing 12, whereby the gradient coil system 2 and the decoupling mechanism 13 being components of the vacuum housing 12. The decoupling mechanism 13 is thereby two-piece, with each part being annularly fashioned. The decoupling mechanism 13 functions as a support connection for the gradient coil system 2 with respect to the remainder of the vacuum housing 12 and prevents the propagation of oscillations of the gradient coil system onto the remainder of the vacuum housing 12 in the sense of the second transmission path. In particular, the propagation of oscillations in the circumferential direction of the hollow-cylindrical gradient coil system 2, that are especially relevant in noise production, is suppressed. Moreover, the vacuum within the vacuum housing 12 prevents the transmission of oscillations in the sense of the first transmission path. Since the gradient coil system 2 as well as the decoupling mechanism 13 form a part of the vacuum housing 12 that is already needed for the operation of the superconducting basic field magnet and the vacuum housing 12 simultaneously carries out two tasks, namely a thermal insulation of the superconducting coil arrangement 10 and avoidance of the transmission of oscillations via the first transmission path, the embodiment according to FIG. 3 is especially economical.

In one embodiment, the decoupling mechanism 13 is releasably connected to the gradient coil system and/or to the remaining vacuum housing 12, and a component of the vacuum housing 12 has a valve mechanism 6 available to it. As a result, a good accessibility for maintenance, repair and replacement of, in particular, the gradient coil system 2 and the decoupling mechanism 13 is also assured in the embodiment according to FIG. 3.

Figure 4:
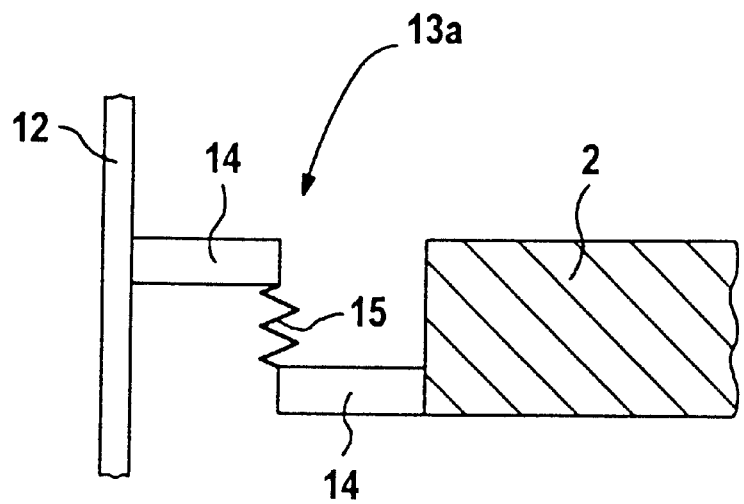
FIG. 4 is a schematic, detailed illustration of the decoupling mechanism from FIG. 3 in an embodiment with a bellows.

In a schematic illustration, FIG. 4 shows a cross-section through one of the annular versions of the decoupling mechanism 13 from FIG. 3. As one embodiment of the decoupling mechanism 13, a decoupling mechanism 13a is thereby shown that has two stiffening elements 14 and a bellows 15. One of the stiffening elements 14 is, for example, connected rigidly and vacuum-tight to the remainder of the vacuum housing 12 and the other is connected to the gradient coil system 2. In particular, the bellows 15 is designed for damping oscillations in circumferential directions of the hollow-cylindrical gradient coil system 2. These oscillations are especially relevant in the production of noise. In the direction of the principal cylinder axis, the decoupling mechanism 13a, particularly the bellows 15, represents a rigid connection. This prevents an oscillation of the overall gradient coil system 2 in the direction of the principal cylinder axis of the hollow-cylindrical gradient coil system 2 from leading to distortions (artifacts) in magnetic resonance images.

Figure 5:
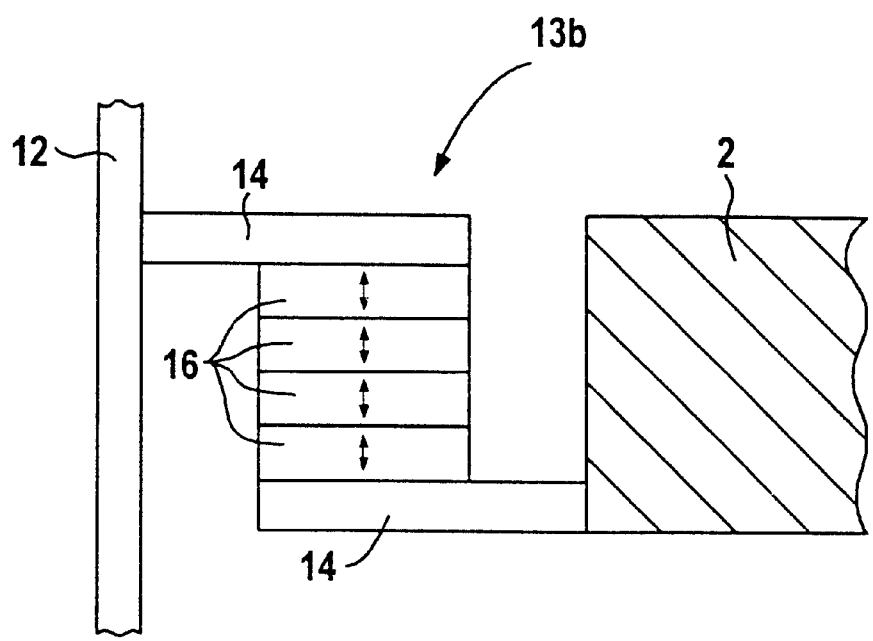
FIG. 5 is a schematic detailed illustration of the decoupling mechanism of FIG. 3 in an embodiment with actuators.

In a schematic illustration, FIG. 5 shows a cross-section through another of the annular versions of the decoupling mechanism 13 from FIG. 3. In this embodiment of the decoupling mechanism 13, a decoupling mechanism 13b is thereby shown that contains a number of piezo-elements 16 and stiffening elements 14. By an appropriate drive, the piezo-elements 16 expand or contract according to the indicated arrow directions. An oscillation-damping or oscillation-decoupling effect thus can be controlled, similar to the bellows from FIG. 4. Otherwise, the decoupling mechanism 13b is fashioned similar to the decoupling mechanism 13a of FIG. 4.

Although modifications and changes may be suggested by those skilled in the art, it is the intention of the inventors to embody within the patent warranted hereon all changes and modifications as reasonably and properly come within the scope of their contribution to the art.

We claim as our invention:

1. A magnetic resonance tomography apparatus comprising:
   a basic field magnet system;
   a gradient coil system; and
   a vacuum housing surrounding an evacuatable space, at least a portion of said vacuum housing being formed by at least a portion of said basic field magnet system and at least a portion of said gradient coil system.

2. A magnetic resonance tomography apparatus as claimed in claim 1 wherein said basic field magnet system has an outer envelope, and wherein said portion of said basic field magnet system forming at least a part of said vacuum housing comprises a region of said outer envelope.

3. A magnetic resonance tomography apparatus as claimed in claim 2 wherein said gradient coil system has a surface directly facing said outer envelope of said basic field magnet system, and wherein said evacuatable space is disposed at least partially between said surface and said outer envelope.

4. A magnetic resonance tomography apparatus as claimed in claim 1 wherein said basic field magnet system has a superconducting coil arrangement with a superconducting coil arrangement vacuum housing, and wherein said vacuum housing having said evacuatable space comprises said superconducting coil arrangement vacuum housing.

5. A magnetic resonance tomography apparatus as claimed in claim 1 wherein said vacuum housing further comprises at least one seal flange between said basic field magnet system and said gradient coil system.

6. A magnetic resonance tomography apparatus as claimed in claim 1 further comprising a valve device contained in said vacuum housing for evacuating said evacuatable space.

7. A magnetic resonance tomography apparatus as claimed in claim 1 wherein said gradient coil system in operation has a dominant natural oscillation node, and further comprising a weight-supporting connector connecting said gradient coil system at said dominant natural oscillation node to said basic field magnet system.

8. A magnetic resonance tomography apparatus as claimed in claim 1 further comprising a carrier for said gradient coil system supporting said gradient coil system mechanically decoupled from said basic field magnet system.

9. A magnetic resonance tomography apparatus as claimed in claim 8 wherein said gradient coil system is a hollow-cylindrical, tubular gradient coil system having a principle cylinder axis and end faces, and a plurality of carrier elements projecting perpendicularly relative to said cylinder axis in respective lower regions of said end faces.

10. A magnetic resonance tomography apparatus as claimed in claim 1 wherein said basic field magnet system has an outer envelope, and further comprising a decoupling mechanism which prevents propagation of mechanical oscillations of said gradient coil system to said outer envelope of said basic field magnet system, said outer envelope containing at least a part of said decoupling mechanism.

11. A magnetic resonance tomography apparatus as claimed in claim 1 further comprising a connection arrangement mechanically connecting said gradient coil system and said basic field magnet system, and a decoupling mechanism, contained in said connection arrangement, which prevents propagation of oscillations of said gradient coil system to said basic field magnet system.

12. A magnetic resonance tomography apparatus as claimed in claim 11 wherein said decoupling mechanism comprises a decoupling element having mechanical properties preventing said propagation of said oscillations.

13. A magnetic resonance tomography apparatus as claimed in claim 12 wherein said decoupling element comprises a bellows.

14. A magnetic resonance tomography apparatus as claimed in claim 12 wherein said decoupling element comprises a component consisting of elastic material.

15. A magnetic resonance tomography apparatus as claimed in claim 11 wherein said decoupling mechanism comprises a plurality of actuators having a spatial size for preventing said propagation of said oscillations.

16. A magnetic resonance tomography apparatus as claimed in claim 15 wherein said plurality of actuators is a plurality of piezoelement actuators.

\* \* \* \* \*